United States Patent
Ma et al.

(10) Patent No.: US 9,455,688 B2
(45) Date of Patent: Sep. 27, 2016

(54) GATE DRIVING CIRCUIT, DISPLAY MODULE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei (CN)

(72) Inventors: Rui Ma, Beijing (CN); Xianjie Shao, Beijing (CN); Guolei Wang, Beijing (CN); Ming Hu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 7 days.

(21) Appl. No.: 14/135,393

(22) Filed: Dec. 19, 2013

(65) Prior Publication Data

US 2014/0176410 A1 Jun. 26, 2014

(30) Foreign Application Priority Data

Dec. 26, 2012 (CN) .......................... 2012 1 0576935

(51) Int. Cl.
*H03K 3/012* (2006.01)
*G09G 3/36* (2006.01)
*G11C 19/28* (2006.01)
*H03K 5/15* (2006.01)

(52) U.S. Cl.
CPC ............ *H03K 3/012* (2013.01); *G09G 3/3622* (2013.01); *G09G 3/3677* (2013.01); *G11C 19/28* (2013.01); *G09G 2310/0267* (2013.01); *G09G 2310/0286* (2013.01); *H03K 5/15093* (2013.01)

(58) Field of Classification Search
CPC combination set(s) only.
See application file for complete search history.

(56) References Cited

U.S. PATENT DOCUMENTS

2008/0012842 A1* 1/2008 Mori .................... G09G 3/3677
345/206
2011/0044423 A1 2/2011 Lin et al.
(Continued)

FOREIGN PATENT DOCUMENTS

| CN | 102467890 A | 5/2012 |
|---|---|---|
| CN | 102708818 A | 10/2012 |
| EP | 2444959 A1 | 4/2012 |

OTHER PUBLICATIONS

European Patent Office Action dated Jul. 3, 2015; Appln. No. 13 197 439.6-1904.
(Continued)

*Primary Examiner* — Gerald Johnson
*Assistant Examiner* — Robert Michaud
(74) *Attorney, Agent, or Firm* — Ladas & Parry LLP (57) ABSTRACT

Provided are a gate driving circuit, a display module and a display device belonging to the field of display technique and being designed for solving the problem of high power consumption of the display module in the prior art. The gate driving circuit is used for driving gates of TFTs corresponding to gate lines connected thereto, and includes at least two stages of shift registers connected in cascade, wherein each stage of shift register includes a first output terminal and a second output terminal, the first output terminal is connected to an enable signal input terminal of a next stage of shift register so as to output a next stage enable signal to the next stage of shift register, and the second output terminal is connected to a corresponding gate line so as to apply a gate driving signal on the gates of TFTs through the corresponding gate line.

16 Claims, 6 Drawing Sheets

(56) References Cited

U.S. PATENT DOCUMENTS

| | | | |
|---|---|---|---|
| 2011/0058640 A1 | 3/2011 | Shang et al. | |
| 2011/0274236 A1 | 11/2011 | Tobita | |
| 2012/0105397 A1* | 5/2012 | Tan .................. | G09G 3/3677 345/205 |
| 2014/0072093 A1 | 3/2014 | Shang et al. | |

OTHER PUBLICATIONS

Partial European Search Report for European Application No. 13197439.6-1904 dated Apr. 25, 2014; nine (9) pages.

First Office Action issued by the Chinese Patent Office for Chinese Patent Application No. 201210576935.5 dated Jul. 1, 2014, 9pgs.

English translation of First Office Action issued by the Chinese Patent Office for Chinese Patent Application No. 201210576935.5 dated Jul. 1, 2014, 10pgs.

English abstract of CN102708818A, 1 page.

Extended European search report issued by the European Patent Office for International Application No. 13197439.6, issued on Sep. 9, 2014, 20 pages.

Office Action issued from the European Patent Office dated Jul. 7, 2016.

\* cited by examiner

GATE DRIVING CIRCUIT, DISPLAY MODULE AND DISPLAY DEVICE

CROSS REFERENCE TO RELATED APPLICATIONS

This application claims priority from Chinese National Application No. 201210576935.5 filed on Dec. 26, 2012, the contents of which are incorporated herein by reference.

TECHNICAL FIELD OF THE DISCLOSURE

The present disclosure relates to a field of display technology, and particularly to a gate driving circuit, a display module and a display device.

BACKGROUND

Liquid crystal displays have advantages of light weight, thin thickness and low power consumption, and thus are widely used in electronic products such as televisions, computers, mobile phones and etc.

In existing liquid crystal displays, a gate driving circuit can be formed on an array substrate so as to form a panel with Gate driving circuit on Array (GOA), which is referred to as GOA panel hereinafter. In the gate driving circuit, several stages of shift registers connected in cascade are included, and a control signal is attenuated when being transferred from one stage of shift register to a next stage of shift register.

In the above GOA panel, a phenomenon that a threshold voltage of a Thin-Film Transistor (referred to as TFT, hereinafter) drifts occurs, in order to maintain characteristics of TFT, size of TFT should be increased, which will lead to increase of load of the gate driving circuit and load of the GOA panel, and thus in turn increase of power consumption of the GOA panel.

SUMMARY

Aiming at the above disadvantages, a gate driving circuit, a display module and a display device are provided in embodiments of the present disclosure.

According to a first aspect of the embodiments of the present disclosure, there is provided a gate driving circuit for driving gates of Thin Film Transistors (TFTs) corresponding to gate lines connected thereto, including at least two stages of shift registers connected in cascade, wherein each stage of shift register includes a first output terminal and a second output terminal, the first output terminal is connected to an enable signal input terminal of a next stage of shift register so as to output a next stage enable signal to the next stage of shift register, and the second output terminal is connected to a corresponding gate line so as to apply a gate driving signal on the gates of TFTs through the corresponding gate line.

According to a second aspect of the embodiments of the present disclosure, there is provided a display module including an array substrate, wherein gate lines are arranged on the array substrate, pixel units are arranged between adjacent gate lines, Thin Film Transistors (TFTs) are arranged in the pixel units, and the gate lines are connected to gates of TFTs respectively, the display module further includes a gate driving circuit connected to the gate lines for driving gates of TFTs corresponding to the gate lines connected thereto, wherein the gate driving circuit includes at least two stages of shift registers connected in cascade, wherein each stage of shift register includes a first output terminal and a second output terminal, the first output terminal is connected to an enable signal input terminal of a next stage of shift register so as to output a next stage enable signal to the next stage of shift register, and the second output terminal is connected to a corresponding gate line so as to apply a gate driving signal on the gates of TFTs corresponding to the corresponding gate line.

According to a third aspect of the embodiments of the present disclosure, there is provided a display device including a display module including an array substrate, wherein gate lines are arranged on the array substrate, pixel units are arranged between adjacent gate lines, Thin Film Transistors (TFTs) are arranged in the pixel units, and the gate lines are connected to gates of TFTs respectively, the display module further includes a gate driving circuit connected to the gate lines for driving gates of TFTs corresponding to the gate lines connected thereto, wherein the gate driving circuit includes at least two stages of shift registers connected in cascade, wherein each stage of shift register includes a first output terminal and a second output terminal, the first output terminal is connected to an enable signal input terminal of a next stage of shift register so as to output a next stage enable signal to the next stage of shift register, and the second output terminal is connected to a corresponding gate line so as to apply a gate driving signal on the gates of TFTs corresponding to the corresponding gate line.

With the gate driving circuit, the display module and the display device, by arranging, in each stage of shift register, a first output terminal connected to a next stage of shift register and a second output terminal connected to a corresponding gate line, load corresponding to each output terminal may be reduced, such that size of a switching transistor may be reduced especially in a low temperature environment, and thus power consumption of the gate driving circuit may be in turn reduced.

BRIEF DESCRIPTION OF THE DRAWINGS

Below, in order to more clearly illustrate the technical solutions in embodiments of the present disclosure or in the prior art, accompanying drawings used in the following description of the embodiments of the present disclosure may be introduced simply. Apparently, the accompanying drawings in the following description are only some embodiments of the present disclosure, and other drawings may be obtained based on these accompanying drawings by those skilled in the art without paying any creative effort.

DETAILED DESCRIPTION

Below, a gate driving circuit, a display module and a display device according to embodiments of the present disclosure will be described in connection with the accompanying drawings.

It should be clear that the described embodiments are not all of embodiments of the present disclosure but only a part of embodiments of the present disclosure. Based on the embodiments described in the present disclosure, all of other embodiments obtained by those skilled in the art without paying creative labor should belong to the scope sought for protection in the present disclosure.

Figure 1:
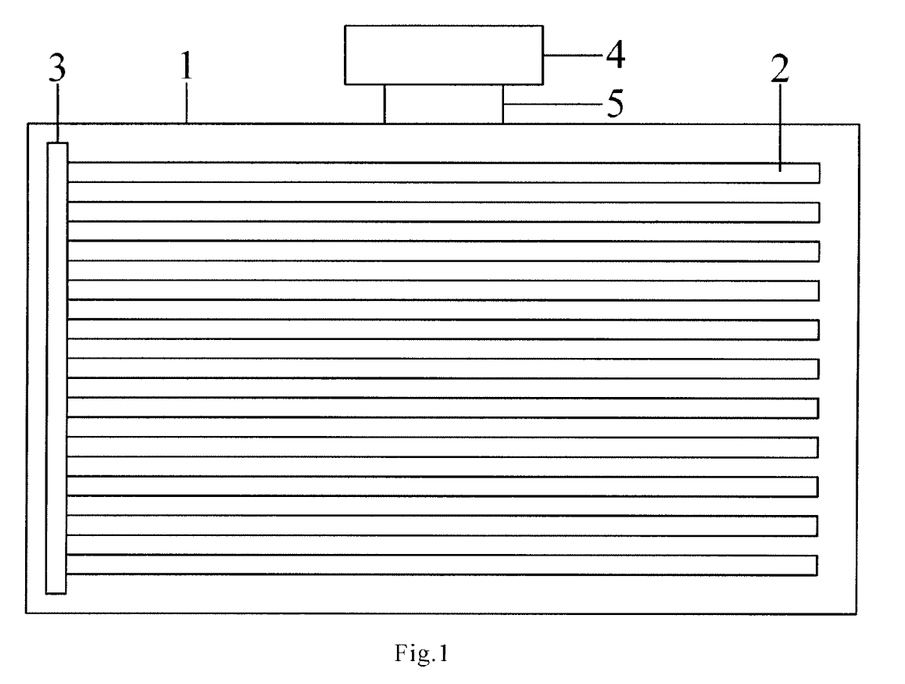
FIG. 1 is a schematic diagram of a structure of a display module according to embodiments of the present disclosure.

As shown in FIG. 1, the display module includes an array substrate 1, wherein gate lines 2 are arranged on the array substrate 1, pixel units (not shown) are arranged between adjacent gate lines 2, Thin Film Transistors (TFTs) (not shown) are arranged in the pixel units, and the gate lines 2 are connected to gates of TFTs respectively.

The display module further includes a gate driving circuit 3 connected to the gate lines 2.

Figure 2:
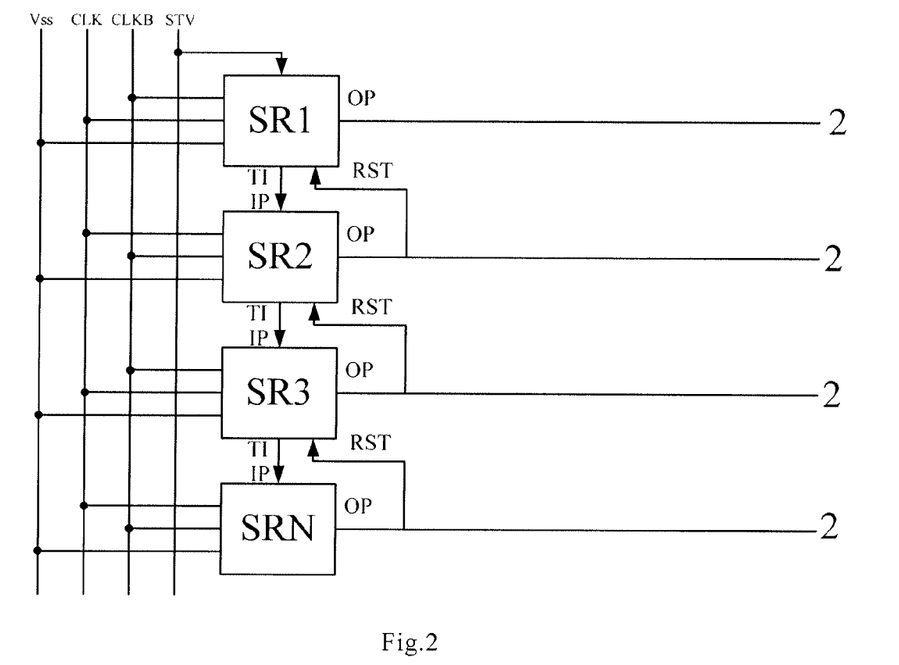
FIG. 2 is a schematic diagram of a structure of a gate driving circuit according to the embodiments of the present disclosure.

The gate driving circuit 3 provided in the embodiments of the present disclosure is used for driving the gates of TFTs corresponding to the gate lines connected thereto. As shown in FIG. 2, the gate driving circuit 3 includes at least two stages of shift registers (SRs) connected in cascade, wherein each stage of shift register (SR) includes a first output terminal TI and a second output terminal OP, wherein the first output terminal TI is connected to an enable signal input terminal IP of a next stage of shift register so as to output a next stage enable signal to the next stage of shift register, and the second output terminal OP is connected to a corresponding gate line 2 so as to apply a gate driving signal on the gates of TFTs through the corresponding gate line 2.

In FIG. 1, the display module further includes a printed circuit board 4 and a flexible circuit board 5 connected between the printed circuit board 4 and the array substrate 1; a control chip is arranged on the printed circuit board 4 to control the display of a display device, wherein the control chip is connected to the gate driving circuit 3 so as to control the gate driving circuit 3 to supply the gate driving signal on the gates of TFTs through the gate lines 2. In addition, the gate driving circuit 3 can be arranged on the array substrate 1 and can be arranged on the printed circuit board 4, and no limitation is made herein.

In FIG. 2, the gate driving circuit 3 includes total N stages of shift registers SRs including the shift registers SR1, SR2, . . . , SRN, the number N of the stages of shift registers is corresponding to the number of the gate lines 2, and the second output terminal OP of each stage of shift register is connected to a corresponding gate line 2, so as to supply a gate driving signal to the gates of TFTs through the corresponding gate line 2 and thus turn on TFTs to achieve deflection of liquid crystal molecules.

In the process of achieving deflection of liquid crystal molecules, description will be given by taking a stage of shift register SR as a reference. Particularly, a low level is applied to a low voltage maintaining terminal Vss, a first clock signal is applied to a first clock signal terminal CLK, and a second clock signal is applied to a second clock signal terminal CLKB, wherein the first clock signal and the second clock signal are clock signals inverted to each other, that is, the second clock signal is at a low level when the first clock signal is at a high level and the second clock signal is at a high level when the first clock signal is at a low level. The low level applied to the low voltage maintaining terminal Vss may be a voltage of −8V, the specific voltage value may be set according to actual requirements, and no limitation is made herein.

When the display module is started, the control chip issues a start signal to the gate driving circuit 3 and the start signal is transferred to a first stage of shift register SR1 through a start signal input terminal STV at this time; the first stage of shift register SR1 receives the start signal, outputs the gate driving signal through the second output terminal OP to a first gate line 2 for turning on TFTs corresponding to the first gate line 2 and meanwhile outputs an enable signal through the first output terminal TI to an enable signal input terminal of a next stage of shift register (that is, a second stage of shift register SR2) following the first stage of shift register SR1; the second stage of shift register SR2 receives the enable signal transferred from the first stage of shift register SR1, outputs the gate driving signal through the second output terminal OP thereof to a second gate line 2 and to a reset terminal of a previous stage of shift register (that is, the first stage of shift register SR1) prior to the second stage of shift register SR2 to reset the previous stage of shift register (such that the previous stage of shift register stops outputting the gate driving signal to the gate line 2 connected thereto, and thus TFTs corresponding to the gate line 2 are turned off), and meanwhile outputs an enable signal through the first output terminal TI of the second stage of shift register SR2 to an enable signal input terminal of a next stage of shift register (that is, a third stage of shift register SR3) following the second stage of shift register SR2.

In the above process, by applying, every stage of shift register from the first stage of shift register SR1 to the $N^{th}$ stage of shift register SRN, the gate driving signal to the gate line 2 connected to the corresponding stage of shift register for turning on TFTs on the corresponding gate line 2, and by outputting the reset signal from a present stage of shift register to a previous stage of shift register to stop the previous stage of shift register outputting the gate driving signal, the progressive scanning on the gate lines 2 can be implemented by the gate driving circuit 3.

In the conventional gate driving circuits, through a same output terminal of the present stage of shift register, the enable signal is supplied to the next stage of shift register and the gate driving signal is transferred to gates of TFTs via the corresponding gate line, and thus the enable signal will be attenuated significantly during the transmission from one stage of shift register to another stage of shift register since the load capacitance of the output terminal of each stage of shift register is large. In order to prevent such attenuation, the size of switching transistors in the gate driving circuit should be enlarged, and in turn the power consumption of the gate driving circuit may be increased. However, with the gate driving circuit according to the embodiments of the present disclosure, the first output terminal and the second output terminal arranged separately can reduce the load capacitance corresponding to each of the output terminals, and thus the size of the switching transistors in the gate driving circuit may be reduced and the power consumption of the gate driving circuit may in turn be reduced.

With the gate driving circuit provided in the embodiments of the present disclosure, by arranging, in each stage of shift register, the first output terminal connected to the next stage of shift register and the second output terminal connected to the corresponding gate line separately, the load corresponding to each of the output terminals can be reduced, the size of the switching transistors can be reduced especially in a low temperature environment, and thus the power consumption of the gate driving circuit can be reduced.

Figure 3:
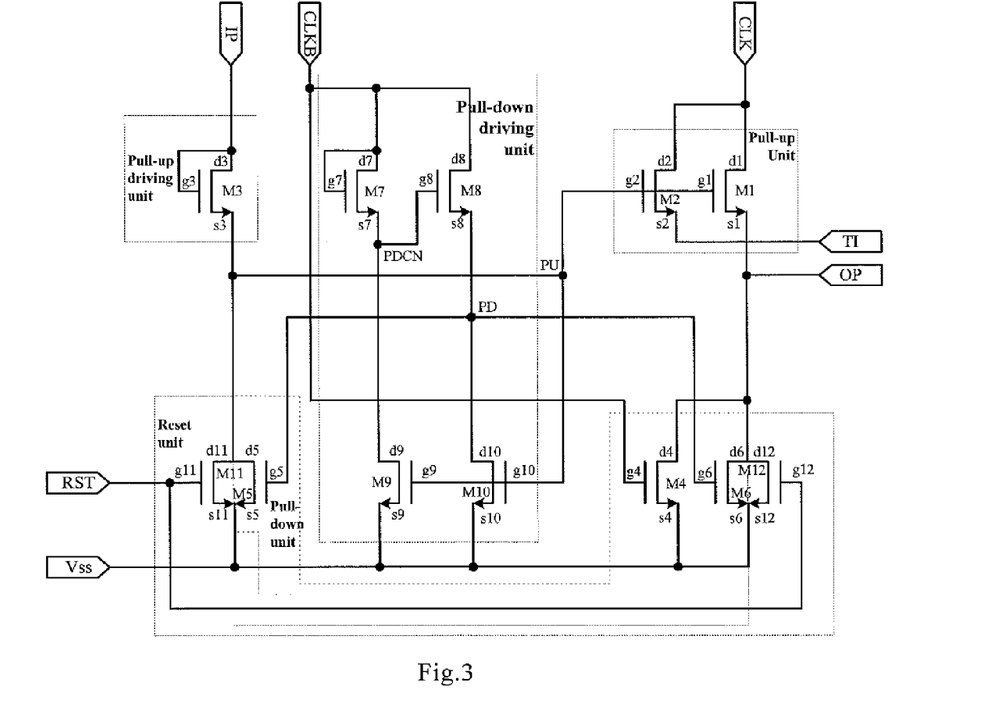
FIG. 3 is a structure diagram of a circuit of a shift register according to the embodiments of the present disclosure.

The specific structure of each stage of shift register SR is described with the second stage of shift register SR2 being taken as an example. As shown in FIG. 3, each stage of shift register SR includes a pull-up unit, a pull-up driving unit, a pull-down unit, a pull-down driving unit and a reset unit.

The pull-up unit is connected to a pull-up node PU, a first clock signal terminal CLK, a first output terminal TI and a second output terminal OP, respectively, and is used for, when a pull-up signal is detected, outputting a next stage enable signal to a next stage of shift register (that is, the third stage of shift register SR3) through the first output terminal TI and outputting a gate driving signal to a corresponding gate line 2 through the second output terminal OP according to an first clock signal acquired.

The pull-up driving unit is connected to the pull-up node PU and an enable signal input terminal IP, respectively, and is used for pulling-up a potential of the pull-up node PU when an enable signal transferred from a previous stage of shift register (that is, the first stage of shift register SR1) is acquired, so as to drive the pull-up unit to output the next stage enable signal to the next stage of shift register and output the gate driving signal to the corresponding gate line 2 according to the first clock signal.

The pull-down unit is connected to the pull-up node PU, a pull-down node PD, a second clock signal terminal CLKB and a low voltage maintaining terminal Vss, respectively, and is used for pulling-down a potential of the second output terminal OP and the potential of the pull-up node PU when a pull-down signal and a second clock signal are detected, so as to stop outputting the gate driving signal and the next stage enable signal, wherein the second clock signal and the first clock signal are inverted to each other.

The pull-down driving unit is connected to the pull-down node PD, the pull-up node PU, the low voltage maintaining terminal Vss and the second clock signal terminal CLKB, respectively, and is used for outputting the pull-down signal for controlling the pull-down unit according to the second clock signal and the pull-up signal when the second clock signal and the pull-up signal are acquired, so as to control the operation of the pull-down unit, particularly to drive the pull-down unit to pull-down the potentials of the pull-up node PU and the second output terminal OP, and thus control to stop outputting the next stage enable signal and the gate driving signal.

The reset unit is connected to the pull-up node PU, the second output terminal OP, the low voltage maintaining terminal Vss and a reset signal input terminal RST, respectively, and is used for pulling-down the potentials of the pull-up node PU and the second output terminal OP when a reset signal is detected, so as to reset the output signals at the first output terminal TI and the second output terminal OP.

The gate driving circuit provided in the embodiments of the present disclosure is as shown in FIG. 2, and includes a plurality of stages of shift registers described above, wherein the second output terminal OP of each stage of shift register outputs the gate driving signal for turning on TFTs on a corresponding gate line 2.

Preferably, except the first stage of shift register SR1 and the last stage of shift register SRN, the second output terminal OP of each stage of shift register is connected to the reset terminal of a previous stage of shift register adjacent thereto.

Except the last stage of shift register SRN, the first output terminal TI of each stage of shift register is connected to the enable signal input terminal IP of a next stage of shift register adjacent thereto, wherein the enable signal input terminal IP of the first stage of shift register SR1 is STV.

Preferably, the reset terminal RST of the last stage of shift register may be connected to the second output terminal OP thereof, or may be connected to the second output terminal OP of a newly added redundant stage of shift register, or may be connected to the signal at STV.

The first clock signal terminals of odd-numbered stages of shift registers input a first clock signal and the second clock signal terminals of the odd-numbered stages of shift registers input a second clock signal; and the first clock signal terminals of even-numbered stages of shift registers input the second clock signal and the second clock signal terminals of the even-numbered stages of shift registers input the first clock signal. A low voltage signal input terminal of each stage of shift register inputs a low level signal.

Below, the specific circuit configuration of the pull-up driving unit, the pull-up unit, the pull-down driving unit, the pull-down unit and the reset unit described above will be further described with the case wherein the gate driving circuit 3 is formed on one side of the array substrate 1 being taken as an example.

The pull-up unit includes a first switching transistor M1 and a second switching transistor M2, wherein the first switching transistor M1 includes a first terminal g1, a second terminal d1 and a third terminal s1, the first terminal g1 of the first switching transistor M1 is connected to the pull-up node PU, the second terminal d1 of the first switching transistor M1 is connected to the first clock signal terminal CLK, and the third terminal s1 of the first switching transistor M1 is connected to the second output terminal OP; the second switching transistor M2 includes a first terminal g2, a second terminal d2 and a third terminal s2, the first terminal g2 of the second switching transistor M2 is connected to the pull-up node PU, the second terminal d2 of the second switching transistor M2 is connected to the first clock signal terminal CLK, and the third terminal s2 of the second switching transistor M2 is connected to the first output terminal TI.

The pull-up driving unit includes a third switching transistor M3, wherein the third switching transistor M3 includes a first terminal g3, a second terminal d3 and a third terminal s3, the first terminal g3 and the second terminal d3 of the third switching transistor M3 are connected to the enable signal input terminal IP, and the third terminal s3 of the third switching transistor M3 is connected to the pull-up node PU.

The pull-down unit includes a fourth switching transistor M4, a fifth switching transistor M5 and a sixth switching transistor M6, wherein the fourth switching transistor M4 includes a first terminal g4, a second terminal d4 and a third terminal s4, the first terminal g4 of the fourth switching transistor M4 is connected to the second clock signal terminal CLKB, the second terminal d4 of the fourth switching transistor M4 is connected to the second output terminal OP, and the third terminal s4 of the fourth switching transistor M4 is connected to the low voltage maintaining terminal Vss; the fifth switching transistor M5 includes a first terminal g5, a second terminal d5 and a third terminal s5, and the sixth switching transistor M6 includes a first terminal g6, a second terminal d6 and a third terminal s6, the first terminal g5 of the fifth switching transistor M5 and the first terminal g6 of the sixth switching transistor M6 are connected to the pull-down node PD, the second terminal d5 of the fifth switching transistor M5 is connected to the pull-up node PU, the second terminal d6 of the sixth switching transistor M6 is connected to the second output terminal OP, and the third terminal s5 of the fifth switching transistor M5 and the third terminal s6 of the sixth switching transistor M6 are connected to the low voltage maintaining terminal Vss.

The pull-down driving unit includes a seventh switching transistor M7, an eighth switching transistor M8, a ninth switching transistor M9 and a tenth switching transistor M10, wherein the seventh switching transistor M7 includes a first terminal g7, a second terminal d7 and a third terminal s7, the first terminal g7 and the second terminal d7 of the seventh switching transistor M7 are connected to the second clock signal terminal CLKB, and the third terminal s7 of the seventh switching transistor M7 is connected to a pull-down control node PDCN; the eighth switching transistor M8 includes a first terminal g8, a second terminal d8 and a third terminal s8, the first terminal g8 of the eighth switching transistor M8 is connected to the pull-down control node PDCN, the second terminal d8 of the eighth switching transistor M8 is connected to the second clock signal terminal CLKB, and the third terminal s8 of the eighth switching transistor M8 is connected to the pull-down node PD; the ninth switching transistor M9 includes a first terminal g9, a second terminal d9 and a third terminal s9, the tenth switching transistor M10 includes a first terminal g10, a second terminal d10 and a third terminal s10, the first terminal g9 of the ninth switching transistor M9 and the first terminal g10 of the tenth switching transistor M10 are connected to the pull-up node PU, the second terminal d9 of the ninth switching transistor M9 is connected to the pull-down control node PDCN, the second terminal d10 of the tenth switching transistor M10 is connected to the pull-down node PD, and the third terminal s9 of the ninth switching transistor M9 and the third terminal s10 of the tenth switching transistor M10 are connected to the low voltage maintaining terminal Vss.

The reset unit includes an eleventh switching transistor M11 and a twelfth switching transistor M12, wherein the eleventh switching transistor M11 includes a first terminal g11, a second terminal d11 and a third terminal s11, the twelfth switching transistor M12 includes a first terminal g12, a second terminal d12 and a third terminal s12, the first terminal g11 of the eleventh switching transistor M11 and the first terminal g12 of the twelfth switching transistor M12 are connected to the reset signal input terminal RST, the second terminal d11 of the eleventh switching transistor M11 is connected to the pull-up node PU, the second terminal d12 of the twelfth switching transistor M12 is connected to the second output terminal OP, and the third terminal s11 of the eleventh switching transistor M11 and the third terminal s12 of the twelfth switching transistor M12 are connected to the low voltage maintaining terminal Vss.

However, the pull-up driving unit, the pull-up unit, the pull-down driving unit, the pull-down unit and the reset unit described above are not limited to the above structure, those skilled in the art can easily know that the above described circuit structure may be replaced by other common circuit structures and the described functions of the above units may be achieved, and no limitation is made herein.

Figure 4:
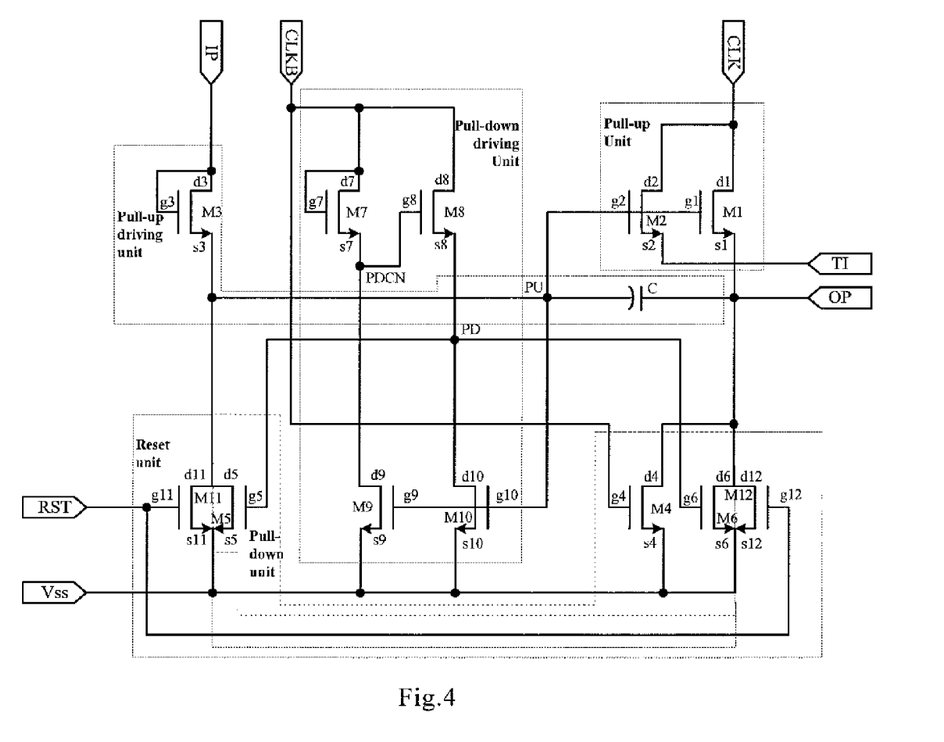
FIG. 4 is a structure diagram of a circuit of another shift register according to the embodiments of the present disclosure.

In order to further increase the potential of the pull-up node PU to reduce the influence of the attenuation at the first output terminal TI and the attenuation at the second output terminal OP on the driving of the next stage of shift register, as shown in FIG. 4, the pull-up driving unit further includes a capacitor C, wherein one terminal of the capacitor C is connected to the pull-up node PU and the other terminal of the capacitor C is connected to the second output terminal OR With the capacitor C arranged between the pull-up node PU and the second output terminal OP, the capacitor C is charged when the enable signal input terminal IP inputs a high level signal, and then functions to generate a bootstrapping effect to further increase the potential at the pull-up node PU when the first clock signal comes, such that the shift registers SRs in the gate driving circuit 3 may be suitable to a large-size display module.

Figure 5:
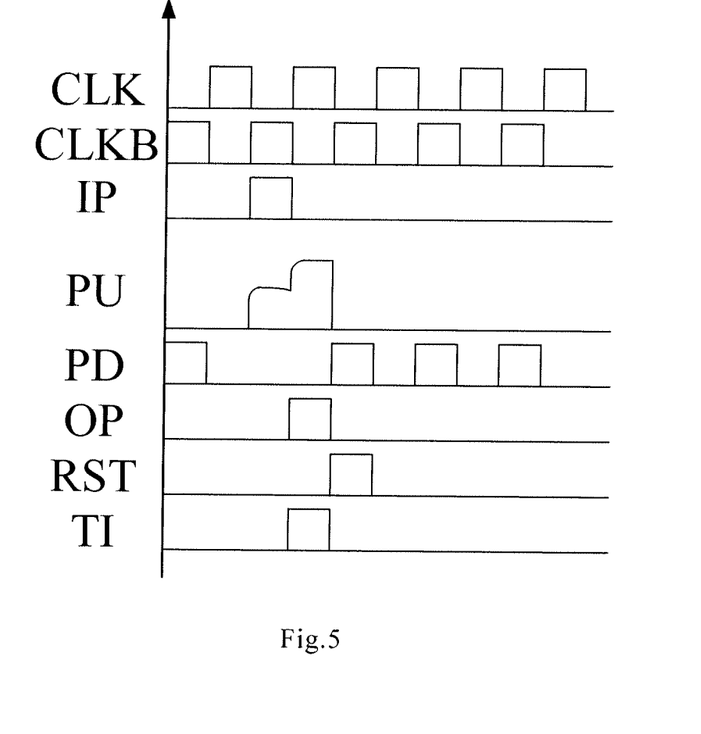
FIG. 5 is a timing sequence diagram of signals in the shift register according to the embodiments of the present disclosure.

Below, the workflow of the gate driving circuit 3 will be described according to the above described circuit structure, and level variation of corresponding respective terminals and/or nodes are as shown in FIG. 5.

At a first phase, the enable signal input terminal IP inputs a high level signal, the second clock signal terminal CLKB also inputs a high level signal, the third switching transistor M3 is turned on, wherein the enable signal input from the enable signal input terminal IP may be the signal output from the first output terminal TI of a previous stage of shift register and may also be the start signal transmitted from the control chip (for example, the enable signal input terminal IP of the first stage of shift register SR1 receivers the start signal STV); after the third switching transistor M3 is turned on, the capacitor C is charged by the high level signal input from the enable signal input terminal IP and thus the potential at the pull-up node PU is pulled up; the ninth switching transistor M9 and the tenth switching transistor M10 are turned on by the high potential at the pull-up node PU, and the seventh switching transistor M7 and the eighth switching transistor M8 are turned on by the high level signal input from the second clock signal terminal CLKB, and sizes of the seventh switching transistor M7 to the tenth switching transistor M10 are adjusted to ensure that the potential at the pull-down node PD is a low potential at this time, such that the fifth switching transistor M5 and the sixth switching transistor M6 in the pull-down unit are turned off, preventing the potential at the pull-up node PU and the potential at the second output terminal OP from being pulled down by the fifth switching transistor M5 and the sixth switching transistor M6, respectively.

At a second phase, the enable signal input terminal IP inputs a low level signal, the third switching transistor M3 is turned off, the pull-up node PU keeps at a high potential, such that the first switching transistor M1 and the second switching transistor M2 are turned on; the first clock signal input from the first clock signal terminal CLK is a high level signal, the potential at the pull-up node PU is further pulled up due to the bootstrapping effect of the capacitor C, such that the first switching transistor M1 and the second switching transistor M2 are turned on without any attenuation being produced and better convert the first clock signal into the first output signal output to the first output terminal TI and the second output signal output to the second output terminal OP, respectively, wherein the first output signal is the enable signal provided to the next stage of shift register, and the second output signal is the gate driving signal applied on the gate line 2 connected to the second output terminal OP for turning on TFTs corresponding to the gate line 2.

At a third phase, the second clock signal terminal CLKB inputs a high level signal, the reset signal input from the reset signal terminal RST is at a high level, wherein the reset signal is input by the second output terminal OP of the next stage of shift register, the eleventh switching transistor M11 and the twelfth switching transistor M12 are turned on so as to pull down the potentials at the pull-up node PU and at the second output terminal OP; in addition, the seventh switching transistor M7 and the eighth switching transistor M8 are turned on and the ninth switching transistor M9 and the tenth switching transistor MlO are turned off, such that the pull-down node PD keeps at a high level, and thus the fifth switching transistor M5 and the sixth switching transistor M6 are turned on; in addition, the fourth switching transistor M4 is turned on; in this way, the potential at the pull-up node PU and the potential at the second output terminal OP are further pulled down, and thus the signal transmission is shut down.

At a fourth phase, the first switching transistor M1 and the second switching transistor M2 are turned off since the potential at the pull-up node PU is pulled down at the third phase; although the first clock signal input from the first clock signal terminal CLK is at a high level at this time, it cannot be converted into the high level signal output to the first output terminal TI and the high level signal output to the second output terminal OP.

At a fifth phase, the second clock signal terminal CLKB inputs a high level signal, the seventh switching transistor M7 and the eighth switching transistor M8 are turned on, such that the pull-down node PD is at a high level, and thus the fifth switching transistor M5 and the sixth switching transistor M6 are turned on, such that the pull-up node PU and the second output terminal OP keep at a low level.

Thereafter, the fourth phase and the fifth phase are repeated sequentially before the first phase occurs again.

From the above workflow, it can be seen that, in each stage of shift register, the enable signal output from the first output terminal TI is not used for turning on gates of TFTs on the corresponding gate line 2 and the gate driving signal output from the second output terminal OP is not used as the reset signal of a next stage of shift register, such that the load capacitance $C_{L1}$ of the enable signal output from the first output terminal TI is small and the load capacitance CL2 of the gate driving signal output from the second output terminal OP is small; according to a power consumption equation: $P_T=C_L V^2 f$, wherein the voltage value V depends on the characteristics of TFT and the frequency f is the frequency of the first clock signal input from the first clock signal terminal CLK, when the load capacitance $C_{L1}$ of the enable signal output from the first output terminal TI is reduced and the load capacitance $C_{L2}$ of the gate driving signal output from the second output terminal OP is reduced in the above described circuit structure, the power consumption of the switching transistors for outputting the gate driving signal to the gate lines 2 is reduced as a whole.

Optionally, the above switching transistors are N-type transistors.

Since TFTs formed on the array substrate are N-type transistors, the gate driving circuits and said TFTs may be integrally formed when the switching transistors in the shift registers SRs are all N-type transistors, thereby reducing the preparation time of the display module.

Figure 6:
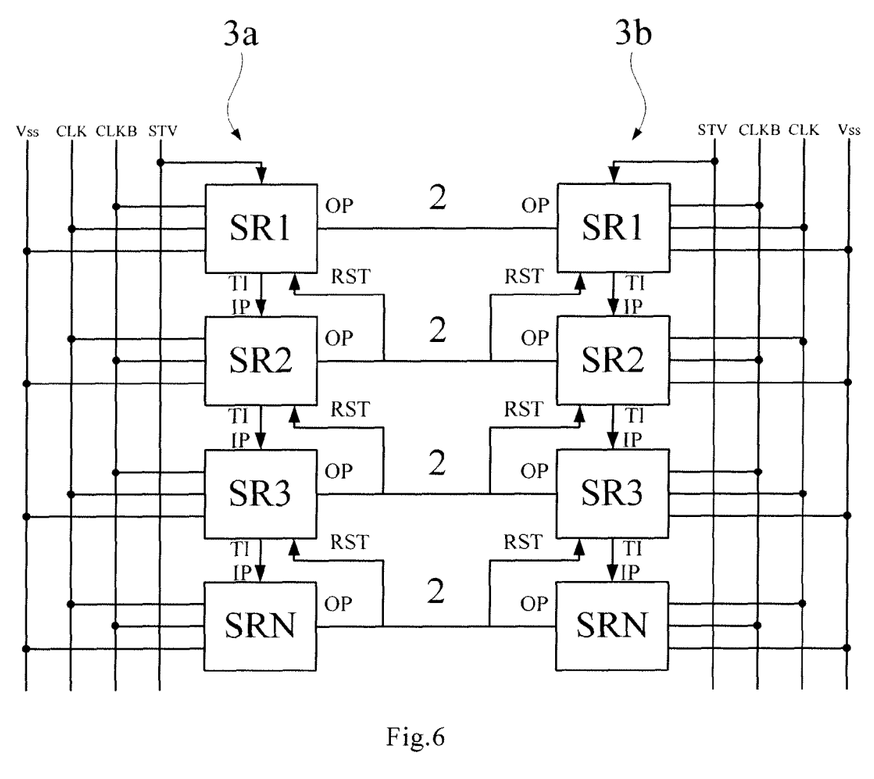
FIG. 6 is a schematic diagram of a structure of an array substrate with gate driving circuits arranged on both sides thereof according to the embodiments of the present disclosure.

Optionally, as shown in FIG. 6, the gate driving circuit 3 includes a first gate driving circuit 3a and a second gate driving circuit 3b formed on two sides of the array substrate 1, respectively, wherein the second output terminal OP of each stage of shift register in the first gate driving circuit 3a is connected to the second output terminal OP of a corresponding stage of shift register in the second gate driving circuit 3b.

By arranging the two gate driving circuit 3 on the two sides of the array substrate 1 respectively and connecting the second output terminals OPs of the shift registers with a same position in the two gate driving circuit 3 to each other, driving may be performed from the two sides of the array substrate 1 to the center of the array substrate 1 when gates of TFTs are driven, thereby avoiding the problem that the gates of TFTs far away from the second output terminal OP of the corresponding stage of shift register SR cannot be driven due to the attenuation in the gate driving signal arriving at the gates of TFTs after being output from the second output terminal OP. So, a large-size display module can be produced.

Corresponding to the gate driving circuit described above, there is provided a display module in the embodiments of the present disclosure, as shown in FIG. 1, the display module includes an array substrate 1, gate lines 2 are arranged on the array substrate 1, pixel units (not shown) are arranged between adjacent gate lines 2, TFTs (not shown) are arranged in the pixel units, and each of the gate lines 2 is connected to gates of TFTs corresponding to the gate line 2.

The display module further includes a gate driving circuit 3 connected to the gate lines 2 for driving the gates of TFTs corresponding to the gate lines connected thereto, and the specific structure of the gate driving circuit 3 is described above and repeated description is omitted herein.

In the display module provided in the embodiments of the present disclosure, by arranging, in each stage of shift register, the first output terminal connected to the next stage of shift register and the second output terminal connected to the corresponding gate line separately, the load corresponding to each of the output terminals can be reduced, the size of the switching transistors can be reduced especially in a low temperature environment, and thus the power consumption of the gate driving circuit can be reduced.

Corresponding to the display module described above, there is provided a display device including the display module described above in the embodiments of the present disclosure, and the specific structure of the display module is described above and repeated description is omitted herein.

In the display device provided in the embodiments of the present disclosure, by arranging, in each stage of shift register, the first output terminal connected to the next stage of shift register and the second output terminal connected to the corresponding gate line separately, the load corresponding to each of the output terminals can be reduced, the size of the switching transistors can be reduced especially in a low temperature environment, and thus the power consumption of the gate driving circuit can be reduced.

The display device may be a liquid crystal panel, electronic paper, an OLED panel, a mobile phone, a tablet computer, a television, a monitor, a notebook computer, a digital picture frame, a navigation system and any other product or part with a display function.

The above descriptions are only for illustrating the embodiments of the present disclosure, and in no way limit the scope of the present disclosure. It will be obvious that those skilled in the art may make modifications, variations and equivalences to the above embodiments without departing the spirit and scope of the present disclosure as defined by the following claims. Such variations and modifications are intended to be included within the spirit and scope of the present disclosure.

What is claimed is:

1. A gate driving circuit for driving gates of Thin Film Transistors TFTs corresponding to gate lines connected thereto, including:
   at least two stages of shift registers connected in cascade,
   wherein each stage of shift register includes a first output terminal and a second output terminal,
   wherein the first output terminal is connected to an enable signal input terminal of a next stage of shift register so as to output a next stage enable signal to the next stage of shift register, and the second output terminal is connected to a corresponding gate line so as to apply a gate driving signal on the gates of TFTs through the corresponding gate line, wherein each stage of shift register includes a pull-up unit connected to a pull-up node, a first clock signal terminal, the first output terminal and the second output terminal, respectively, for, when a pull-up signal at a high level is detected, outputting a next stage enable signal to the next stage of shift register through the first output terminal and outputting the gate driving signal to the corresponding gate line through the second output terminal according to an first clock signal acquired;

each stage of shift register further includes a pull-down unit connected to the pull-up node, a pull-down node, a second clock signal terminal and a low voltage maintaining terminal, respectively, for pulling-down a potential of the second output terminal and the potential of the pull-up node when a pull-down signal at a high level is detected and for pulling-down the potential of the second output terminal when a second clock signal at a high level is detected, wherein the second clock signal and the first clock signal are inverted to each other;

each stage of shift register further includes a pull-down driving unit connected to the pull-down node, the pull-up node, the low voltage maintaining terminal and the second clock signal terminal, respectively, for outputting the pull-down signal at the high level when the second clock signal at the high level and the pull-up signal at a low level are detected.

2. The gate driving circuit of claim 1, wherein the pull-up unit

Includes a first switching transistor and a second switching transistor, wherein the first switching transistor includes a first terminal, a second terminal and a third terminal, the first terminal of the first switching transistor is connected to the pull-up node, the second terminal of the first switching transistor is connected to the first clock signal terminal, and the third terminal of the first switching transistor is connected to the second output terminal;

wherein the second switching transistor includes a first terminal, a second terminal and a third terminal, the first terminal of the second switching transistor is connected to the pull-up node, the second terminal of the second switching transistor is connected to the first clock signal terminal, and the third terminal of the second switching transistor is connected to the first output terminal.

3. The gate driving circuit of claim 1 wherein each stage of shift register further includes a pull-up driving unit connected to the pull-up node and an enable signal input terminal, respectively, for pulling-up a potential of the pull-up node when an enable signal is acquired, so as to drive the pull-up unit to output the next stage enable signal and the gate driving signal according to the first clock signal.

4. The gate driving circuit of claim 3, wherein the pull-up driving unit includes a third switching transistor, wherein the third switching transistor includes a first terminal, a second terminal and a third terminal, the first terminal and the second terminal of the third switching transistor are connected to the enable signal input terminal, and the third terminal of the third switching transistor is connected to the pull-up node.

5. The gate driving circuit of claim 4, wherein the pull-up driving unit further includes a capacitor, wherein one terminal of the capacitor is connected to the pull-up node and the other terminal of the capacitor is connected to the second output terminal.

6. The gate driving circuit of claim 1 wherein the pull-down unit includes a fourth switching transistor, a fifth switching transistor and a sixth switching transistor, wherein the fourth switching transistor includes a first terminal, a second terminal and a third terminal, the first terminal of the fourth switching transistor is connected to the second clock signal terminal, the second terminal of the fourth switching transistor is connected to the second output terminal, and the third terminal of the fourth switching transistor is connected to the low voltage maintaining terminal;

wherein the fifth switching transistor includes a first terminal, a second terminal and a third terminal, and the sixth switching transistor includes a first terminal, a second terminal and a third terminal, the first terminal of the fifth switching transistor and the first terminal of the sixth switching transistor are connected to the pull-down node, the second terminal of the fifth switching transistor is connected to the pull-up node, the second terminal of the sixth switching transistor is connected to the second output terminal, and the third terminal of the fifth switching transistor and the third terminal of the sixth switching transistor are connected to the low voltage maintaining terminal.

7. The gate driving circuit of claim 1 wherein the pull-down driving unit includes a seventh switching transistor, an eighth switching transistor, a ninth switching transistor and a tenth switching transistor, wherein the seventh switching transistor includes a first terminal, a second terminal and a third terminal, the first terminal and the second terminal of the seventh switching transistor are connected to the second clock signal terminal, and the third terminal of the seventh switching transistor is connected to a pull-down control node;

wherein the eighth switching transistor includes a first terminal, a second terminal and a third terminal, the first terminal of the eighth switching transistor is connected to the pull-down control node, the second terminal of the eighth switching transistor is connected to the second clock signal terminal, and the third terminal of the eighth switching transistor is connected to the pull-down node;

wherein the ninth switching transistor includes a first terminal, a second terminal and a third terminal, the tenth switching transistor includes a first terminal, a second terminal and a third terminal, the first terminal of the ninth switching transistor and the first terminal of the tenth switching transistor are connected to the pull-up node, the second terminal of the ninth switching transistor is connected to the pull-down control node, the second terminal of the tenth switching transistor is connected to the pull-down node, and the third terminal of the ninth switching transistor and the third terminal of the tenth switching transistor are connected to the low voltage maintaining terminal.

8. The gate driving circuit of claim 1, wherein each stage of shift register further includes a reset unit connected to the pull-up node, the second output terminal, the low voltage maintaining terminal and a reset signal input terminal, respectively, for resetting the pull-up node and the second output terminal when a reset signal is detected.

9. The gate driving circuit of claim 8, wherein the reset unit includes an eleventh switching transistor and a twelfth switching transistor,
wherein the eleventh switching transistor includes a first terminal, a second terminal and a third terminal, the twelfth switching transistor includes a first terminal, a second terminal and a third terminal, the first terminal of the eleventh switching transistor and the first terminal of the twelfth switching transistor are connected to the reset signal input terminal, the second terminal of the eleventh switching transistor is connected to the pull-up node, the second terminal of the twelfth switching transistor is connected to the second output terminal, and the third terminal of the eleventh switching transistor and the third terminal of the twelfth switching transistor are connected to the low voltage maintaining terminal.

10. The gate driving circuit of claim 1, wherein the gate driving circuit includes a first gate driving circuit and a second gate driving circuit formed on two sides of an array substrate, respectively, wherein the second output terminal of each stage of shift register i n the first gate driving circuit is connected to the second output terminal of a corresponding stage of shift register in the second gate driving circuit, wherein driving is performed from the two sides of the array substrate to the center of the array substrate when the gates of TFTs are driven.

11. A display module including an array substrate, wherein gate lines are arranged on the array substrate, pixel units are arranged between adjacent gate lines, Thin Film Transistors TFTs are arranged in the pixel units, and each of the gate lines is connected to gates of TFTs corresponding to the gate line, wherein the display module further includes a gate driving circuit for driving gates of TFTs corresponding to the gate lines connected thereto, the gate driving circuit includes:
at least two stages of shift registers connected in cascade, wherein each stage of shift register includes a first output terminal and a second output terminal,
wherein the first output terminal is connected to an enable signal input terminal of a next stage of shift register so as to output a next stage enable signal to the next stage of shift register, and the second output terminal is connected to a corresponding gate line so as to apply a gate driving signal on the gates of TFTs through the corresponding gate line.
wherein each stage of shift register includes a pull-up unit connected to a pull-up node, a first clock signal terminal, the first output terminal and the second output terminal, respectively, for, when a pull-up signal at a high level is detected, outputting a next stage enable signal to the next stage of shift register through the first output terminal and outputting the gate driving signal to the corresponding gate line through the second output terminal according to an first clock signal acquired;
each stage of shift register further includes a pull-down unit connected to the pull-up node, a pull-down node, a second clock signal terminal and a low voltage maintaining terminal, respectively, for pulling-down a potential of the second output terminal and the potential of the pull-up node when a pull-down signal at a high level is detected and for pulling-down the potential of the second output terminal when a second clock signal at a high level is detected, wherein the second clock signal and the first clock signal are inverted to each other;
each stage of shift register further includes a pull-down driving unit connected to the pull-down node, the pull-up node, the low voltage maintaining terminal and the second clock signal terminal, respectively, for outputting the pull-down signal at the high level when the second clock signal at the high level and the pull-up signal at a low level are detected.

12. The display module of claim 11, wherein each stage of shift register further includes a pull-up driving unit connected to the pull-up node and an enable signal input terminal, respectively, for pulling-up a potential of the pull-up node when an enable signal is acquired, so as to drive the pull-up unit to output the next stage enable signal and the gate driving signal according to the first clock signal.

13. The display module of claim 11, wherein each stage of shift register further includes a reset unit connected to the pull-up node, the second output terminal, the low voltage maintaining terminal and a reset signal input terminal, respectively, for resetting the pull-up node and the second output terminal when a reset signal is detected.

14. A display device including the display module of claim 11.

15. The display module of claim 11, wherein the pull-down driving unit includes a seventh switching transistor, an eighth switching transistor, a ninth switching transistor and a tenth switching transistor,
wherein the seventh switching transistor includes a first terminal, a second terminal and a third terminal, the first terminal and the second terminal of the seventh switching transistor are connected to the second clock signal terminal, and the third terminal of the seventh switching transistor is connected to a pull-down control node;
wherein the eighth switching transistor includes a first terminal, a second terminal and a
third terminal, the first terminal of the eighth switching transistor is connected to the pull-down control node, the second terminal of the eighth switching transistor is connected to the second clock signal terminal, and the third terminal of the eighth switching transistor is connected to the pull-down node;
wherein the ninth switching transistor includes a first terminal, a second terminal and a third terminal, the tenth switching transistor includes a first terminal, a second terminal and a third terminal, the first terminal of the ninth switching transistor and the first terminal of the tenth switching transistor are connected to the pull-up node, the second terminal of the ninth switching transistor is connected to the pull-down control node, the second terminal of the tenth switching transistor is connected to the pull-down node, and the third terminal of the ninth switching transistor and the third terminal of the tenth switching transistor are connected to the low voltage maintaining terminal.

16. The display module of claim 11, wherein the gate driving circuit includes a first gate driving circuit and a second gate driving circuit formed on two sides of an array substrate, respectively, wherein the second output terminal of each stage of shift register in the first gate driving circuit is connected to the second output terminal of a corresponding stage of shift register in the second gate driving circuit,
wherein driving is performed from the two sides of the array substrate to the center of the array substrate when the gates of TFTs are driven.

* * * * *